US008242863B2

(12) United States Patent
Schmitz et al.

(10) Patent No.: US 8,242,863 B2
(45) Date of Patent: Aug. 14, 2012

(54) ACTIVE INDUCTANCE FOR VERY HIGH FREQUENCIES BASED ON CMOS INVERTERS

(75) Inventors: Oliver Schmitz, Hannover (DE); Sven Karsten Hampel, Hannover (DE); Fabian Beichert, Laatzen (DE); Marc Tiebout, Finkenstein (AT)

(73) Assignee: Infineon Technologies AG, Neubiberg (DE)

(*) Notice: Subject to any disclaimer, the term of this patent is extended or adjusted under 35 U.S.C. 154(b) by 800 days.

(21) Appl. No.: 12/192,793

(22) Filed: Aug. 15, 2008

(65) Prior Publication Data
US 2010/0039192 A1    Feb. 18, 2010

(51) Int. Cl.
*H03H 11/00*    (2006.01)
(52) U.S. Cl. ......................................... 333/214; 333/215
(58) Field of Classification Search .................. 333/213, 333/214, 215, 216, 217
See application file for complete search history.

(56) References Cited

U.S. PATENT DOCUMENTS

| 5,543,756 | A  | * | 8/1996  | Anderson ................. 333/186 |
|-----------|----|---|---------|-----------------------------------|
| 5,825,265 | A  | * | 10/1998 | Fujii ....................... 333/215 |
| 6,490,706 | B2 | * | 12/2002 | Mattisson ................ 716/100 |
| 6,577,212 | B1 | * | 6/2003  | Mattisson et al. ........... 333/215 |
| 6,737,944 | B2 | * | 5/2004  | Kunikiyo ................... 333/214 |
| 6,794,956 | B2 | * | 9/2004  | Taniguchi et al. ........... 333/172 |
| 7,522,023 | B2 | * | 4/2009  | Chang et al. .............. 333/215 |
| 2006/0017526 | A1 | * | 1/2006 | Hughes ..................... 333/215 |

FOREIGN PATENT DOCUMENTS
WO    WO2004105234    12/2004

OTHER PUBLICATIONS
Millman, "Microelectronics", 1979, McGraw-Hill; pp. 237, 254.*
"LC circuit", http://en.wikipedia.org/wiki/LC_circuit, Dec. 2, 2007.*

* cited by examiner

*Primary Examiner* — Dean O Takaoka
*Assistant Examiner* — Alan Wong
(74) *Attorney, Agent, or Firm* — Lee & Hayes, PLLC

(57) ABSTRACT

The present disclosure relates to techniques for simulating electrical inductance.

11 Claims, 4 Drawing Sheets

ACTIVE INDUCTANCE FOR VERY HIGH FREQUENCIES BASED ON CMOS INVERTERS

BACKGROUND

Inductors are linear, passive devices that are well known in the electrical engineering arts. Essentially, an inductor is a helically wound coil of wire that stores energy in the form of a magnetic field when an electrical current flows through the wire. A magnetically permeable core material, such as iron, can be used to increase the inductive value of the inductor. Inductors are characterized by inductive reactance in accordance with the following expression:

$$X_L = 2 \cdot \pi \cdot f \cdot L \quad \text{(Equation 1)}$$

Wherein:

$X_L$ is the inductive reactance in Ohms;

f is the frequency of the applied current in Hertz; and;

L is the value of the inductor in Henries.

Inductive reactance is akin to resistance, wherein the reactive value $X_L$ increases with applied frequency.

Inductors are commonly applied in many types of circuits due, among other reasons, to their reactive behavior that is complimentary in nature to the capacitive reactance of capacitors. Non-limiting examples of circuits that utilize inductors include oscillators, filters, radio frequency tuning stages, and a myriad of others. Unfortunately, inductors are generally bulky in comparison to modern semiconductor circuitry. In the interest of addressing the immediately foregoing and other concerns, circuits that simulate electrical inductance without the use of actual inductors have been devised. Such inductive simulation circuits are commonly referred to as active inductors. One feasible way to implement such active inductor circuits is to use so-called Operational Transconductance Amplifier (OTA) circuits within a special feedback topology. These circuits are commonly referred to as "gyrators".

FIG. 1 depicts a gyrator circuit (gyrator) 100 in accordance with known techniques. The gyrator 100 includes a first circuit portion 102 comprising a plurality of inverters 104A through 104F. Each of the inverters 104A-104F is defined by a pair of nMOS and pMOS transistors coupled in a series circuit arrangement. Specifically, each inverter 104A-104F includes a nMOS transistor 106 and a pMOS transistor 108. Each transistor 106 has a source node coupled to a source of ground (i.e., negative) potential, and a drain node coupled to an output node for that particular inverter 104A-104F. In turn, each transistor 108 includes a source node coupled to the output node for that particular inverter 104A-104F, and a drain node coupled to a source of positive potential. The transistors 106 and 108 include respective gate nodes that are connected together to define an input node for that particular inverter 104A-104F. Moreover, circuit portion 102 can be structured as follows: the inverters 104A-104B form an OTA circuit that is loaded by the inverters 104C-104F. In this way, the first circuit portion 102 includes a total of six inverters 104A through 104F, respectively.

The gyrator 100 also includes a second circuit portion 110. The second circuit portion 110 includes a plurality of inverters 104G through 104L. Each of the inverters 104G-104L is defined by an nMOS transistor 106 and a pMOS transistor 108 having the respective nodal characteristics and coupling/connecting as described above in regard to the inverters 104A-104F of the first circuit portion 102. Therefore, the second circuit portion 110 includes a total of six inverters 104G through 104L, respectively.

The gyrator 100 further includes a third circuit portion 112. The third circuit portion 112 includes two input biasing stages 114A and 114B, respectively. Each input biasing stage includes an nMOS transistor 116 and a pMOS transistor 118 and a resistor 120.

It is noted that the second circuit portion 110 is connected to the first circuit portion 102 by way of four respective nodes 130, 132, 134 and 136. In this way, the second circuit portion 110 is connected in feedback circuit arrangement with the first circuit portion 102 of the gyrator 100. Nodes 130 and 134 further define (i.e., are electrically equivalent to) first and second gyrator input nodes, respectively. Additionally, nodes 132 and 136 further define first and second gyrator output nodes, respectively. The gyrator 100 includes twelve inverters 104A-104L, comprising twenty-four transistors. Overall, the gyrator 100 includes a total of (at least) twenty-eight transistors, including the biasing circuitry of the third circuit portion 112.

Generally known gyrator practice involves the use of Operational Transconductance Amplifier (OTA) circuits which are interconnected with one another with feedback and are capacitively loaded so as to simulate inductive behavior at their input terminals. Modern communication standards require this inductive behavior at very high frequencies. Fortunately, technological scaling has resulted in steadily improving high frequency characteristics within individual MOS transistor devices. However, decreasing supply voltages complicate the realization of sufficiently linear active inductor circuits. While the known gyrator 100 represents one approach to simulating electrical inductance and providing sufficient linearity, gyrator circuits capturing even higher frequencies while maintaining linearity are desirable.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Figure 1:
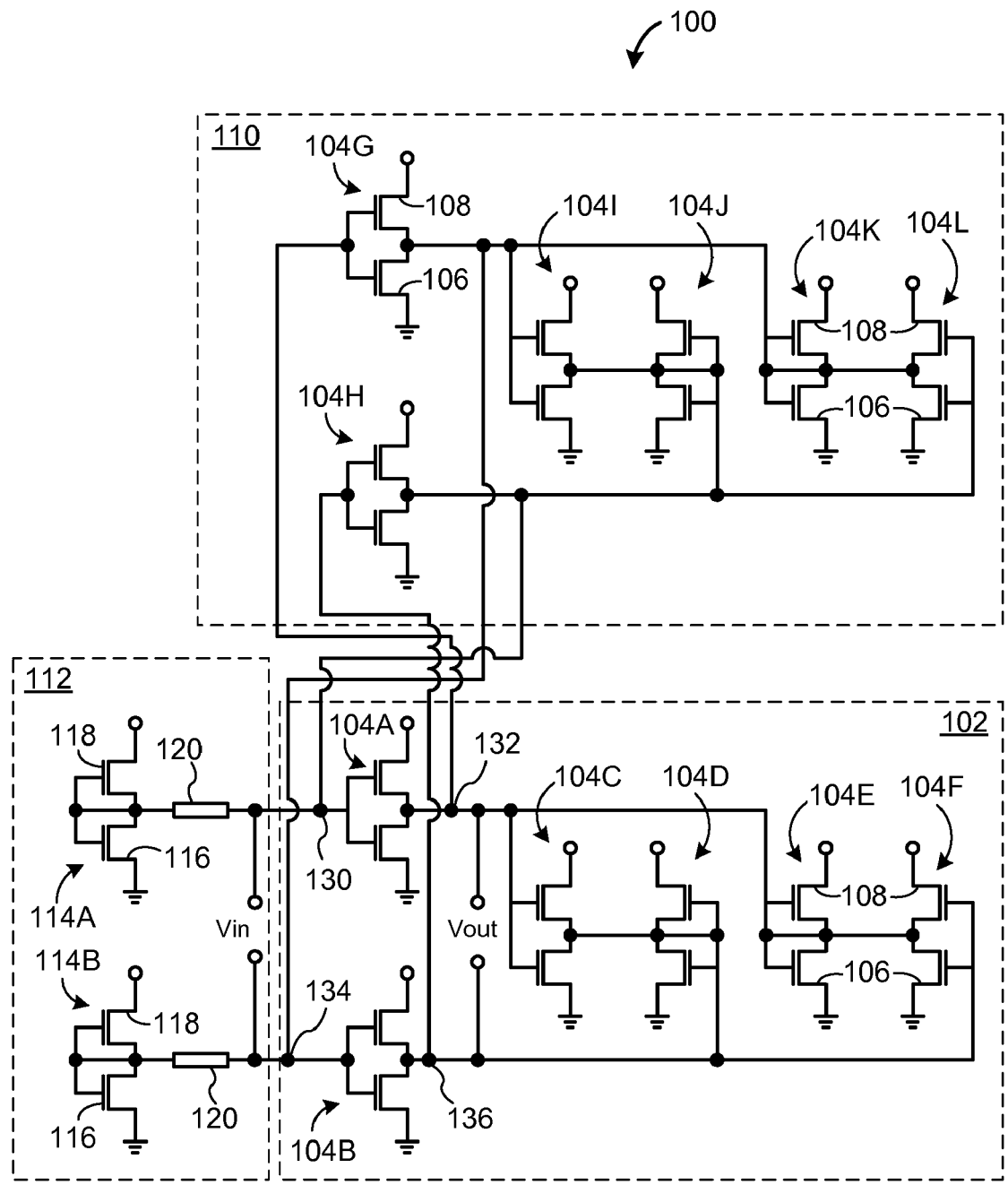
FIG. 1 is a schematic diagram depicting a gyrator circuit according to known techniques.

Disclosed herein are techniques for simulating electrical inductance. Techniques in accordance with the present disclosure may advantageously improve performance by reducing overall physical size of electronic circuitry within any of a number of applications. In general, techniques for simulating inductance as taught by the present disclosure have reduced component counts and exhibit greater resonant frequencies than those known in the art.

According to one implementation, an electronic circuit includes a first circuit portion. The first circuit portion includes a first inverter and a second inverter. The electronic circuit also includes a second circuit portion, including a third inverter and a fourth inverter. The second circuit portion is coupled in feedback circuit arrangement with the first circuit portion, such that the electronic circuit is configured to simulate electrical inductance. The electronic circuit is characterized by a resonant frequency of at least fifteen gigahertz.

According to another implementation, a gyrator includes a first circuit portion. The first circuit portion includes a first inverter and a second inverter, wherein the first circuit portion is defined by a first node, a second node, a third node, and a fourth node. The gyrator also includes a second circuit portion. The second circuit portion includes a third inverter coupled to the second node and the third node. The second circuit portion further includes a fourth inverter coupled to the first node and the fourth node. The second circuit portion includes no inverters other than the third inverter and the fourth inverter. The gyrator is configured to simulate electrical inductance.

According to still another implementation, an apparatus is provided, including a source of electrical energy. The apparatus also includes an electronic circuit coupled to the source of electrical energy. The electronic circuit includes a first circuit portion having at least two inverters, the first circuit portion being defined by a first node and a second node and a third node and a fourth node. The electronic circuit also includes a second circuit portion. The second circuit portion includes an inverter connected in feedback circuit arrangement with the first circuit portion by way of the second node and the third node. The second circuit portion includes another inverter connected in feedback circuit arrangement with the first circuit portion by way of the first node and the fourth node. In this way, the second circuit portion includes not more than two inverters. The electronic circuit is configured to simulate electrical inductance.

In yet another implementation, an apparatus includes a gyrator. The gyrator is configured to simulate electrical inductance. Furthermore, the gyrator includes not more than eight inverters.

Circuits and functional aspects provided herein can be fabricated, at least in part, on a common substrate, such as a semiconductor substrate, such that one or more respective integrated circuit devices are defined. In one or more implementations, at least a portion of the functional subject matter presented herein can be fabricated within a 130, 90, 65, 45, or 32 nanometer (or smaller) environment.

The techniques described herein may be implemented in a number of ways. Illustrative context is provided below with reference to the included figures and ongoing discussion.

First Illustrative Implementation

Figure 2:
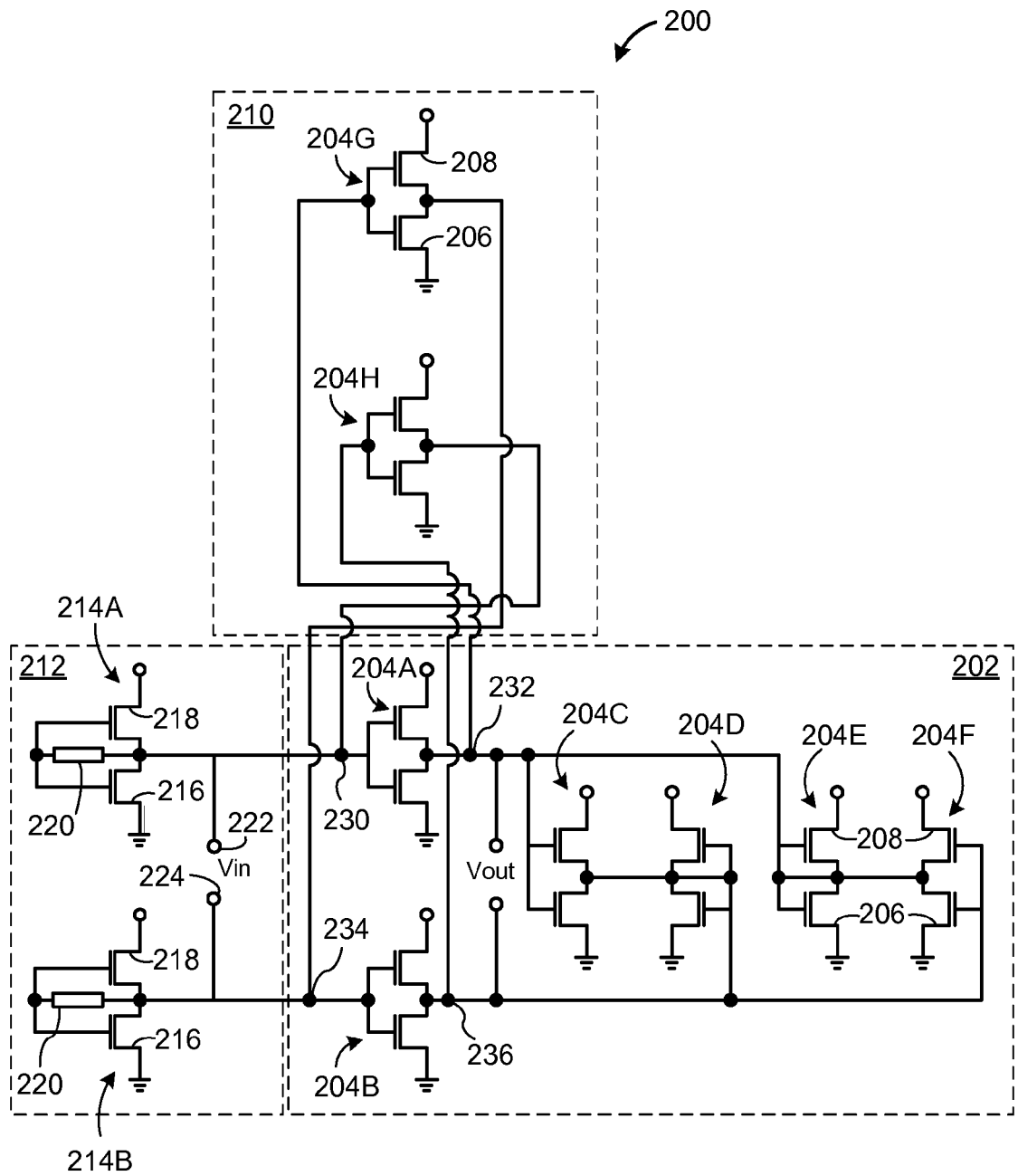
FIG. 2 is a schematic diagram depicting a gyrator circuit according to the present teachings.

FIG. 2 depicts a gyrator 200 in accordance with the present teachings. The gyrator 200 includes a first circuit portion 202. The first circuit portion 202 includes a plurality of inverters 204A through 204F. Each of the inverters 204A-204F is defined by an nMOS and pMOS transistor pair coupled in a series circuit arrangement. In particular, each inverter 204A-204F includes an nMOS transistor 206 and a pMOS transistor 208. Each transistor 206 has a source node coupled to a source of ground (i.e., negative) potential, and a drain node coupled to an output node for that particular inverter 204A-204F. In turn, each transistor 208 includes a source node coupled to the output node for that particular inverter 204A-204F, and a drain node coupled to a source of positive potential. The transistors 206 and 208 of each particular inverter 204A-204F include respective gate nodes that are connected together to define an input node. Moreover, circuit portion 202 can be structured as follows: the inverters 204A-204B form an OTA circuit that is loaded by the inverters 204C-204F. In this way, the first circuit portion 202 includes a total of six inverters 204A through 204F, respectively.

The gyrator 200 also includes a second circuit potion 210. The second circuit portion 210 includes a pair of inverters 204G and 204H forming another OTA circuit. Each of the inverters 204G and 204H is defined by an nMOS transistor 206 and a pMOS transistor 208 having the respective nodal characteristics and coupling/connecting as described above in regard to the inverters 204A-204F of the first circuit portion 202. Therefore, the second circuit portion 210 includes two—and only two—inverters 204G and 204H, respectively.

The gyrator 200 further includes a third circuit portion 212. The third circuit portion 212 includes two input biasing stages 214A and 214B, respectively. Each input biasing stage 214A-214B includes an nMOS transistor 216 and a pMOS transistor 218 coupled in series circuit arrangement. Specifically, each transistor 216 includes a source node coupled to a source of negative (i.e. ground) potential, and a drain node coupled to an output node of the particular input biasing stage 214A or 214B. In turn, each transistor 218 includes a source node coupled to the output node for that input biasing stage 214A or 214B, and a drain node coupled to a source of positive potential. Additionally, each of the transistors 216 and 218 for a particular input biasing stage 214A-214B includes respective gate nodes that are connected together. Respective gyrator input nodes 222 and 224 are also defined within the third circuit portion 212.

The second circuit portion 210 is connected to the first circuit portion 202 by way of four respective nodes 230, 232, 234 and 236. In this way, the second circuit portion 210 is connected in feedback circuit arrangement with the first circuit portion 202 of the gyrator 200.

The gyrator 200 includes a total of eight inverters 204A-204H, comprising sixteen transistors. Overall, the gyrator 200 includes a total of twenty transistors. Thus, the gyrator 200 in accordance with the present teachings represents a measurable reduction in overall component count relative to the known gyrator 100 of FIG. 1. The gyrator 200 can be selectively capacitively loaded between nodes 232 and 236 such that a selective (i.e., switchable) active inductance is achieved. Such an active inductance is applicable, for example, in radio transmitting and/or receiving circuits and to numerous other scenarios. One possible application (among others) of the gyrator 200 is within a reconfigurable ultra-wideband (UWB) radio transceiver.

Illustrative Performance Comparison

Figure 3:
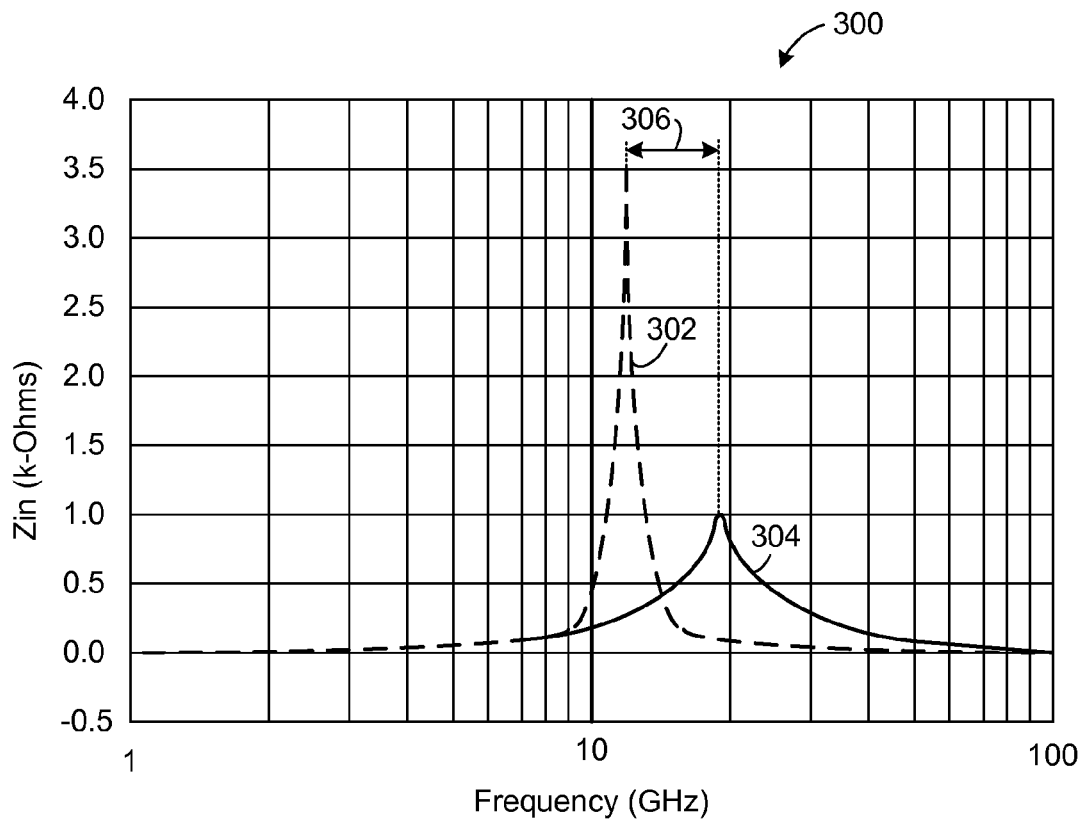
FIG. 3 is a diagram depicting impedance versus frequency for two respective gyrator circuits.

FIG. 3 is a diagram 300 depicting impedance-versus-frequency response for two respective and illustrative gyrator circuits. One of ordinary skill in the electrical engineering arts will appreciate that impedance may be defined as a complex value in accordance with the following expression:

$$Z = R + j(X_L - X_C) \quad \text{(Equation 2)}$$

Wherein:
Z is the overall impedance in Ohms;
R is resistance in Ohms;
$X_L$ is inductive reactance in Ohms;
$X_C$ is capacitive reactance in Ohms; and
j is the imaginary operator ($j = \sqrt{-1}$)

Thus, Equation 2 includes both real and imaginary components. It is further noted that inductive reactance $X_L$ and capacitive reactance $X_C$ represent positive and negative values, respectively, on the imaginary axis. Thus, Equation 2 represents the complimentary nature of inductive and capacitive reactance types.

Attention is returned to FIG. 3, which includes an impedance-versus-frequency curve 302. The response curve 302 corresponds to the input impedance for a known gyrator 100. Thus, the response curve 302 corresponds to known gyrator performance. The response curve 302 is indicative of peak impedance at a resonant frequency of approximately 12 GHz. It is important to note that parasitic (i.e., internal and inherent) capacitance contributes to the overall frequency-dependant performance of the gyrator 100, including the peak impedance shown in response curve 302.

FIG. 3 further includes another impedance-versus-frequency curve 304. The response curve 304 corresponds to the input impedance of a gyrator 200 in accordance with the present teachings. The response curve 304 is indicative of a resonant frequency and corresponding peak impedance that occurs at a higher frequency than that of the response curve 302—a differential (or shift) 306 of about 5.5 GHz. This is largely attributable to the reduced parts count and correspondingly reduced parasitic capacitance of the gyrator 200 relative to that of the known gyrator 100. Also, as illustrated in FIG. 3 by the response curve 304, the input impedance of a gyrator 200 may be equal to or below 1500 ohms at a resonant frequency of the gyrator 200.

FIG. 3 depicts respective performance curves 302 and 304 that are illustrative and non-limiting in nature. Other respective implementations having other performance curves (e.g., differing peak impedances and/or peak resonant frequencies) are also contemplated by the present teachings.

First Illustrative Apparatus

Figure 4:
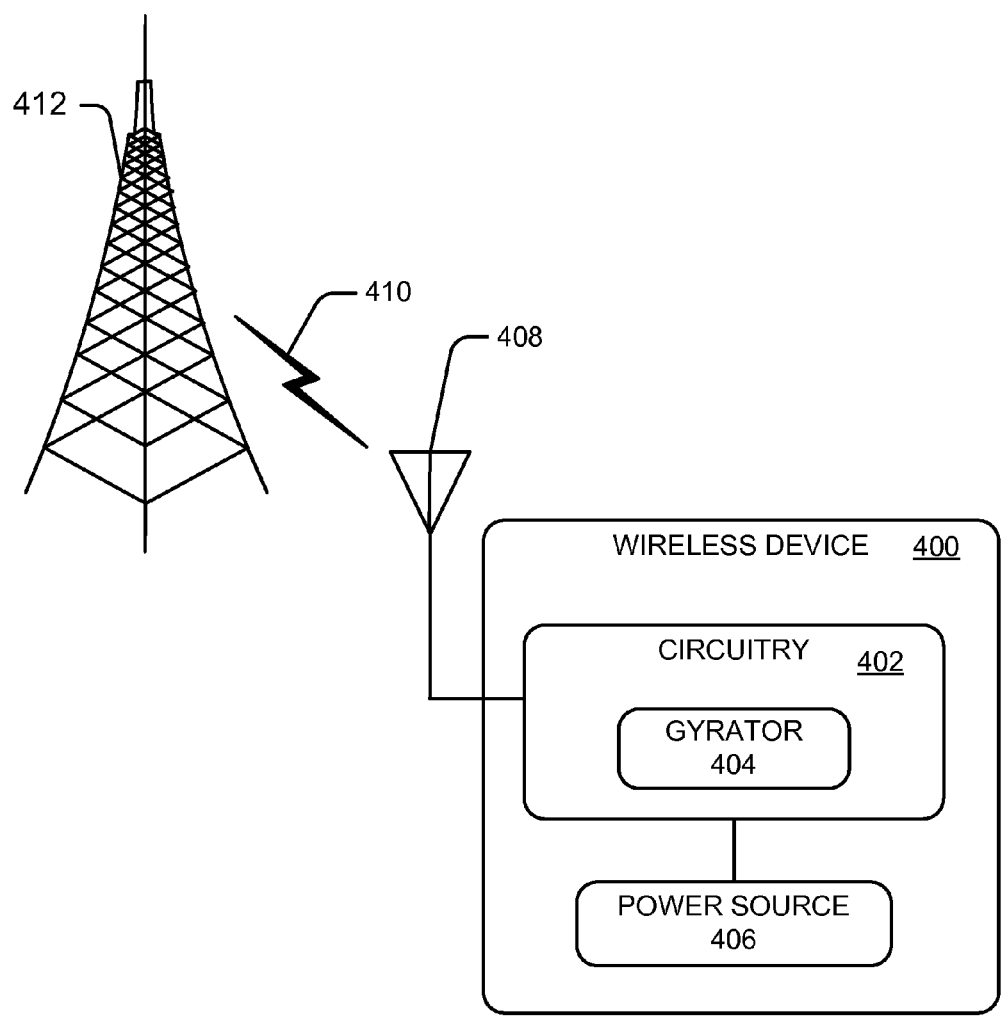
FIG. 4 is a block diagram depicting an apparatus in accordance with the present teachings.

FIG. 4 is a block diagrammatic view depicting a wireless device (i.e., apparatus) 400 including aspects of the present teachings. For purposes of non-limiting example, the wireless device 400 is presumed to include various resources that are not specifically depicted in the interest of clarity. The wireless device 400 is further presumed to be configured to perform in one or more wireless operating modes (e.g., cellular communications, global positioning system (GPS) reception, wireless Internet access, etc.).

The wireless device 400 includes circuitry 402. The circuitry 402 includes, among other possible features, a gyrator 404 in accordance with the present teachings (e.g., gyrator 200). The gyrator 404 is configured to simulate electrical inductance without the use of any inductor component(s) in the conventional sense. In this way, the gyrator 404 provides electrically inductive behavior in combination with reduced size relative to conventional inductors. In any case, the gyrator 404 operates as, or as a portion of, an oscillator, a tuned section, a filter, or some other functional aspect of the circuitry 402.

The wireless device 400 further includes a source of electrical energy or "power source" 406. In one or more implementations, the power source 406 is defined by one or more batteries. In other implementations, the power source 406 may be defined by an inductively coupled power supply that is energized by an electromagnetic illumination field provided externally to the wireless device 400. Other types of power source 406 may also be used. In any case, the power source 406 is coupled so as to provide electrical energy to the circuitry 402. In this way, the wireless device 400 is presumed to be operable in a portable manner.

The wireless device 400 further includes an antenna 408. The wireless device 400 is presumed to operate by way of wireless signals 410 between the antenna 408 and a wireless network 412. A single cellular tower 412 is depicted in the interest of simplicity. However, it is to be understood that other resources (not shown) of a corresponding wireless network are also present and operative as needed so as to enable the wireless device 400 to perform its various functions (cellular communications, Internet access, etc.). The wireless device 400 is a general and non-limiting example of countless devices and systems that may be configured and operating in accordance with the means and techniques of the present teachings.

Second Illustrative Apparatus

Figure 5:
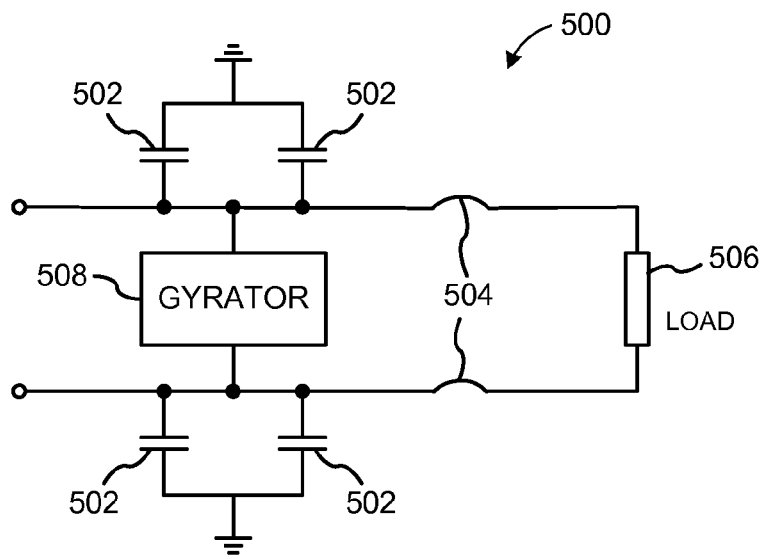
FIG. 5 is a schematic diagram depicting an illustrative impedance matching circuit including aspects of the present teachings.

FIG. 5 is a schematic view of a circuit 500. The circuit 500 shows an illustrative and non-limiting application of the present teachings. Other circuits including aspects of the present teachings are also contemplated. The circuit 500 is configured to match impedances between an on-chip output stage and an off-chip antenna. Besides the common connection configuration comprised of the bond-wires 504 and pad capacitances 502, the circuit 500 includes additional capacitors 506. These additional load capacitors 506 are coupled between respective sides of the circuit 500 and a source of ground potential. As depicted, the circuit 500 is coupled to a load 510 by way of bond-wires 504 or through any other suitable manner of connection.

The circuit 500 also includes a gyrator 508 in accordance with the present teachings. The gyrator 508 is configured to simulate an electrical inductance such that the circuit 500 operates at predetermined overall impedance and at predetermined operating frequency. In this way, the number of actual (i.e., conventional) inductors required within the circuit 500 is reduced (or eliminated) relative to known approaches.

CONCLUSION

For the purposes of this disclosure and the claims that follow, the terms "coupled" and "connected" have been used to describe how various elements interface. Such described interfacing of various elements may be either direct or indirect, unless otherwise is particularly stated. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. An apparatus, comprising:
   a source of electrical energy; and
   an electronic circuit coupled to the source of electrical energy, the electronic circuit including:
      a first circuit portion including at least two inverters, the first circuit portion defined by a first node and a second node and a third node and a fourth node, and
      a second circuit portion including an inverter connected in feedback circuit arrangement with the first circuit portion by way of the second node and the third node, the second circuit portion including another inverter connected in feedback circuit arrangement with the first circuit portion by way of the first node and the fourth node, the second circuit portion including not more than two inverters, the electronic circuit configured to simulate electrical inductance and the electronic circuit having an input impedance equal to or below 1500 ohms at a resonant frequency of the electronic circuit.

2. The apparatus according to claim 1, wherein the apparatus is configured to perform one or more wireless operations.

3. The apparatus according to claim 1, wherein the second node defines a first output node of the electronic circuit, and wherein the fourth node defines a second output node of the electronic circuit.

4. The apparatus according to claim 1, wherein the electronic circuit does not require more than twenty transistors in order to simulate the electrical inductance.

5. An apparatus, comprising:
a gyrator configured to simulate electrical inductance, the gyrator including not more than eight inverters and the gyrator including:
a first circuit portion including a first inverter and a second inverter, wherein the first inverter is coupled to a first gyrator input node and a first gyrator output node and the second inverter is coupled to a second gyrator input node and a second gyrator output node;
a second circuit portion including a third inverter and a fourth inverter, wherein the third inverter is coupled to the first gyrator output node and the second gyrator input node and the fourth inverter is coupled to the second gyrator output node and the first gyrator input node; and
a third circuit portion including a first input biasing stage coupled to the first gyrator input node and a second input biasing stage coupled to the second gyrator input node, the first biasing stage including an nMOS transistor, a pMOS transistor, and a first resistor, wherein a gate node of the nMOS transistor and a gate node of the pMOS transistor are coupled to a common node, a source of the pMOS transistor is coupled to a first input biasing stage output node, a drain of the nMOS transistor is coupled to the first biasing stage output node, and the resistor is coupled between the common node and the first biasing stage output node.

6. The apparatus according to claim 5, wherein the gyrator includes not more than twenty transistors.

7. The apparatus according to claim 5, wherein the gyrator is characterized by a resonant frequency of at least fifteen gigahertz.

8. A gyrator, comprising:
a first circuit portion including a first inverter and a second inverter, the first circuit portion defined by a first gyrator input node, a second gyrator input node, a first gyrator output node, and a second gyrator output node, wherein the first inverter is coupled to the first gyrator input node and the first gyrator output node and the second inverter is coupled to the second gyrator input node and the second gyrator output node;
a second circuit portion including a third inverter and a fourth inverter, the second circuit portion including no inverters other than the third inverter and the fourth inverter, wherein the third inverter is coupled to the first gyrator output node and the second gyrator input node and the fourth inverter is coupled to the second gyrator output node and the first gyrator input node, the gyrator configured to simulate electrical inductance; and
a third circuit portion including a first input biasing stage coupled to the first gyrator input node and a second input biasing stage coupled to the second gyrator input node, the first biasing stage including a first nMOS transistor and a first pMOS transistor and the second biasing stage including a second nMOS transistor and a second pMOS transistor.

9. The gyrator according to claim 8, wherein the gyrator includes not more than eight inverters.

10. The gyrator according to claim 8, wherein any inverter of the gyrator includes:
a first transistor having a first drain node and a first gate node; and
a second transistor having a second source node connected to the first drain node and a second gate node connected to the first gate node.

11. The gyrator according to claim 8, wherein the gyrator requires not more than twenty transistors in order to simulate the electrical inductance.

\* \* \* \* \*